US012068207B2

(12) United States Patent
Wang et al.

(10) Patent No.: US 12,068,207 B2
(45) Date of Patent: Aug. 20, 2024

(54) SIMULTANEOUS MULTI-BANDWIDTH OPTICAL INSPECTION OF SEMICONDUCTOR DEVICES

(71) Applicant: Taiwan Semiconductor Manufacturing Company, Hsinchu (TW)

(72) Inventors: Shih-Chang Wang, Tainan (TW); Hsiu-Hui Huang, Hsinchu (TW); Hung-Yi Chung, Taoyuan (TW); Chien-Huei Chen, Kaohsiung (TW); Xiaomeng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 133 days.

(21) Appl. No.: 17/826,318

(22) Filed: May 27, 2022

(65) Prior Publication Data

US 2023/0411223 A1 Dec. 21, 2023

(51) Int. Cl.
*H01L 21/66* (2006.01)
*G01N 21/95* (2006.01)

(52) U.S. Cl.
CPC ......... *H01L 22/12* (2013.01); *G01N 21/9505* (2013.01)

(58) Field of Classification Search
CPC ............... H01L 22/12; G01N 21/9501; G01N 21/9505; G01N 21/956
See application file for complete search history.

(56) References Cited

U.S. PATENT DOCUMENTS

| 5,096,280 | A | 3/1992 | Hamada |
| 2003/0231302 | A1 | 12/2003 | Hunt |
| 2004/0008341 | A1 | 1/2004 | Iizuka et al. |
| 2007/0081151 | A1* | 4/2007 | Shortt ................. G01N 21/47 356/237.2 |
| 2009/0315988 | A1 | 12/2009 | Fukazawa |
| 2013/0308124 | A1* | 11/2013 | Ramachandran .. G01N 21/8422 356/237.2 |
| 2020/0264111 | A1* | 8/2020 | Chou ................. G01N 21/9503 |

OTHER PUBLICATIONS

Taiwan Office Action of Application No. 11320257410 Dated Mar. 14, 2024.

* cited by examiner

*Primary Examiner* — Peter B Kim
(74) *Attorney, Agent, or Firm* — Lippes Mathias LLP

(57) ABSTRACT

A method of qualifying semiconductor wafer processing includes: illuminating a semiconductor wafer simultaneously with source light having wavelengths in a plurality of wavebands, including at least a first waveband and a second waveband, the second waveband being different from the first waveband; separating light reflected from the semiconductor wafer as a result of said illuminating, the separating dividing the reflected light according to waveband; generating a first image of the semiconductor wafer based on reflected light separated into the first waveband; and, generating a second image of the semiconductor wafer base on reflected light separated into the second waveband.

20 Claims, 5 Drawing Sheets

SIMULTANEOUS MULTI-BANDWIDTH OPTICAL INSPECTION OF SEMICONDUCTOR DEVICES

BACKGROUND

The following relates to the semiconductor arts, and in particular, to a method and apparatus for the optical inspection of semiconductor devices, for example, during the manufacturing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
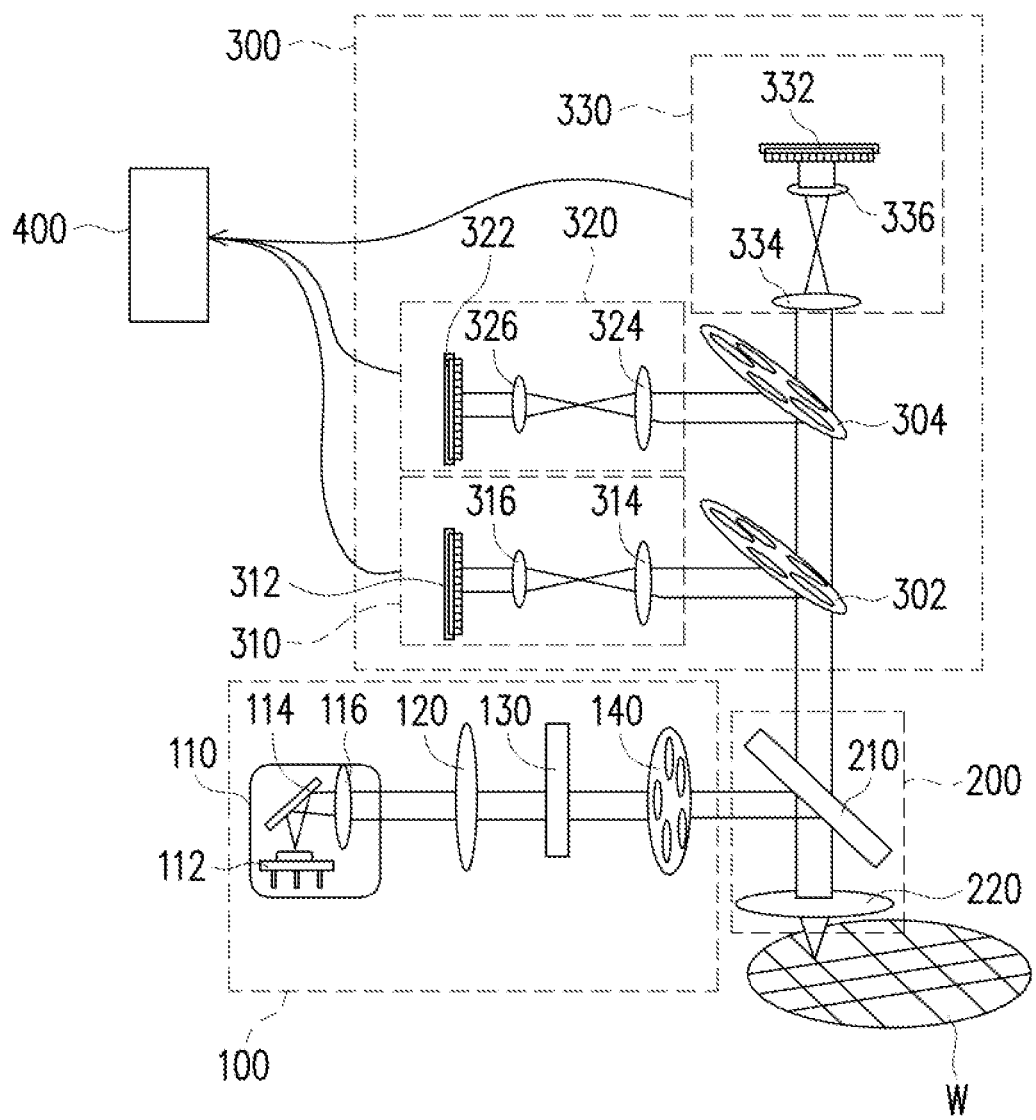
FIG. 1 diagrammatically illustrates an optical inspection system and/or apparatus for inspecting semiconductor wafers for defects in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, there is disclosed herein a system, tool, apparatus and/or method for performing optical inspection of semiconductor wafers, for example, to detect defects therein, such as where the semiconductor wafer under test sufficiently deviates from an intended design or the like at a given location being inspected, for example, at a given die or cell formed or defined on the semiconductor wafer. In some suitable embodiments, the optical inspection as disclosed herein simultaneously illuminates the semiconductor wafer with light having wavelengths in multiple wavebands. In some suitable embodiments, the light in each waveband can be independently conditioned, for example, so that a wide variety of combinations of illumination characteristics and/or traits can be produced.

Advantageously, optical inspection in accordance with the approach described herein can increase throughput in the semiconductor manufacturing process by illuminating the wafer simultaneously with light in multiple wavebands, there obviating a need to perform multiple inspections, while retaining the benefit of inspecting the wafer with light in multiple wavebands. In some embodiments, simultaneous illumination in multiple wavebands can limit mis-alignments and/or the consequences thereof that could otherwise arise when doing multiple distinct inspections. Advantageously, inspecting the wafer with multiple wavebands aids in detecting a variety of different defect type which may have varying sensitivity to different optical inspection modes and/or wavebands. For example, different wavebands may be relatively better or worse for detecting various different defect types, accordingly overall defect detection and/or classification can be advantageously improved using illumination having wavelengths in multiple different wavebands. Disclosed embodiments also enable independently conditioning the light of each waveband, e.g. with respect to intensity, polarization, and/or beam spot, which can also enable more effective defect detection and/or classification, for example by enabling targeted detection of defects that are expected to preferentially interact with light of a particular polarization, and/or by enabling use of a beam spot size and/or shape matching an expected size and/or shape of defects of a certain class. Moreover, as different wavebands of light may effectively penetrate the semiconductor wafer to a greater or lesser extent, simultaneously using multiple wavebands can help enhance defect detection in lower layers. For example, a defect buried under the surface of the wafer being inspected may be mainly detected by the long waveband, but a strong surface scattering light might negatively impact the purity of the long waveband signal. In that case, the short waveband image could be used as the reference (for example, a weight factor might be a negative number) to reduce the surface background noise. Therefore, the defect signal obtained from a diffing image could be stronger than that obtained from the original image.

Generally, in the optical inspection of semiconductor wafers, one waveband (for example, a relatively longer waveband) may be better suited to achieving a good quality test-to-design alignment, while having a relatively lower sensitivity to defects; and conversely, a different waveband (for example, a relatively shorter waveband) may be better suited and/or more sensitive to defects, while being relatively less well suited to achieving a good quality test-todesign alignment. Accordingly, one advantage of using multiple waveband light for optical inspection of semiconductor wafers as disclosed herein is the ability to benefit from the relative strengths of each waveband in a single inspection.

In some suitable embodiments, the collected light reflected from the semiconductor wafer may be sensed and resulting images processed independently according to waveband. Employing separate image sensors for different wavebands can advantageously help guard against oversaturation of a given sensor and processing multiple different waveband images and/or a suitably weighted combined resulting image can help improve defect detection.

FIG. 1 shows an optical inspection system and/or apparatus 1000 for inspecting a semiconductor wafer W for defects in accordance with some embodiments disclosed herein. In particular, as shown in FIG. 1, the optical inspection system and/or apparatus 1000 includes: an illumination unit or module 100 that provides source light which is projected to illuminate the semiconductor wafer W; a focusing unit or module 200 that directs and/or focuses source light from the illumination unit or module 100 onto a particular location of the semiconductor wafer W being inspected; a collection unit or module 300 that collects and/or otherwise receives light reflected from the semiconductor wafer W as a result of its illumination with source light from the illumination unit or module 100; and an image processor 400 that processes one or more images generated and/or formed in accordance with the reflected light collected and/or received by the collection unit or module 300.

In some suitable embodiments, for example, as shown in FIG. 1, the illumination unit or module 100 includes a common light source 110 that generates and/or emits a beam of light (also referred to herein generally as source light) having wavelengths in a plurality of wavebands, for example, including a first short wavelength waveband, a second medium wavelength waveband and a third long wavelength waveband. As used herein in this context the terms "short," "medium" and "long" refer to the relative length of wavelengths encompassed by and/or included in each waveband as compared to one another. That is to say, wavelengths in the short wavelength waveband are generally shorter than wavelengths in the medium wavelength waveband and wavelengths in the medium wavelength waveband are generally shorter than wavelengths in the long wavelength waveband. For example, the short wavelength waveband (also simply referred to herein as the short waveband) may encompass wavelengths in a range of about 150 nanometers (nm) to about 200 nm, the medium wavelength waveband (also simply referred to herein as the medium waveband) may encompass wavelengths in a range of about 190 nm to about 220 nm, and the long wavelength waveband (also simply referred to herein as the long waveband) may encompass wavelengths in a range of about 220 nm to about 260 nm. In another example, the short waveband may encompass wavelengths in a range of about 190 nm to about 260 nm, the medium waveband may encompass wavelengths in a range of about 200 nm to about 300 nm, and the long waveband may encompass wavelengths in a range of about 260 nm to about 320 nm. In still another example, the short waveband may encompass wavelengths in a range of about 300 nm to about 360 nm, the medium waveband may encompass wavelengths in a range of about 320 nm to about 380 nm, and the long waveband may encompass wavelengths in a range of about 360 nm to about 420 nm. In yet another example, the short waveband may encompass wavelengths in a range of about 300 nm to about 400 nm, the medium waveband may encompass wavelengths in a range of about 400 nm to about 460 nm, and the long waveband may encompass wavelengths in a range of about 400 nm to about 650 nm. In another example, the short waveband may encompass wavelengths in a range of about 650 nm to about 1000 nm, the medium waveband may encompass wavelengths in a range of about 1000 nm to about 1300 nm, and the long waveband may encompass wavelength in a range of about 1300 nm to about 1600 nm. In some embodiments, various combinations of the foregoing example ranges may be employed. It is to be appreciated that these are merely nonlimiting illustrative examples, and that more generally the plurality of wavebands can include two, three, four, or more different wavebands each chosen for its effectiveness for a certain type or class of defect detection. In embodiments employing only two wavebands, they may for example be conveniently labeled as the short waveband and the long waveband.

As shown in FIG. 1, the light source 110 may include a light generating and/or emitting device 112, for example, such as a suitable laser or light emitting diode (LED) or other like light generating/emitting device, along with suitable beam steering and/or shaping optics, for example, such as the illustrated mirror 114 and lens 116. In some suitable embodiments, an optional optical amplifier or the like may further be included with the light source 110 to amplify and/or increase an intensity of the light produced by the light source 110 and/or device 112, for example, to twice or four times or more of its original intensity. A suitable optical amplifier may include, but is not limited to, a solid-state amplifier, a doped fiber amplifier, a semiconductor optical amplifier or a laser amplifier, such as a radio-frequency (RF) pumped, a fast axial flow or a carbon dioxide ($CO_2$) laser amplifier.

For simplicity and/or clarity, only a single device 112 is shown in FIG. 1 in connection with the common light source 110. However, in practice, it is to be appreciated that the common light source 110 may include a plurality of such light generating/emitting devices. For example, the common light source 110 may include an array of lasers, each generating and/or emitting light at some particular or single wavelength between, for example, about 150 nm to about 500 nm. For example, the array may include one or more lasers or LEDs or other like light generating/emitting devices, each generating and/or emitting light with a wavelength of about, for example, 157 nm, 193 nm, 213 nm, 222 nm, 224 nm, 248 nm, 266 nm, 308 nm, 325 nm, 332 nm, 347 nm, 351 nm, 355 nm, 441 nm, 488 nm, etc., such that the output light beam or source light from the light source 110 collectively includes wavelengths in a plurality of the aforementioned wavebands, for example, the short, medium and long wavebands.

As shown in FIG. 1, the illumination unit or module 100 may also include a neutral-density (ND) filter 120, a polarizer 130 and/or an aperture plate 140 arranged along the optical path of the light from the light source 110, for example, such that the source light pass through each one in succession. In some embodiments, each and/or any one or more of the ND filter 120, the polarizer 130 and/or the aperture plate 140 may be selectively adjustable to regulate an optical parameter of the source light produced. For example, the ND filter 120 may be selectively adjustable to control and/or regulate an intensity of the source light, the polarizer 130 may be selectively adjustable to control and/or regulate a polarization of the source light, and/or the aperture plate 140 may be selectively adjustable to control and/or regulate a size and/or shape of an aperture provided for the source light. Accordingly, the source light produced by the illumination unit or module 100 may be selectively conditioned, manipulated and/or modified accordingly.

In some embodiments, as shown in FIG. 1, the focusing unit or module 200 directs and/or focuses source light from the illumination unit or module 100 onto a particular location of the semiconductor wafer W being inspected, and may also collect light reflected from the semiconductor W (for example, as a result of its illumination by the source light) and/or direct the reflected light to the collection unit or module 300. In practice, the focusing unit or module 200 may include suitable optics for beam steering, focusing, shaping and/or light collection, such as the selective beam steering element 210 and lens 220 illustrated by way of example in FIG. 1.

In some suitable embodiments, the semiconductor wafer W may be held by and/or secured to a suitable chuck, for example, a vacuum or electrostatic chuck, included with a mount that selectively positions the semiconductor wafer W relative to the focusing unit or module 200. In some suitable embodiments, the mount and/or focusing unit or module 200 may be selectively translatable or otherwise movable with respect to one another. Accordingly, various locations on the semiconductor wafer W may be successively aligned, for example, with an optical axis of the focusing unit or module 200, such that the various locations may in turn be illuminated by source light from the illumination unit or module 100 and inspected for defects accordingly.

In some embodiments, as shown in FIG. 1, the collection unit or module 300 receives light reflected from the semiconductor wafer W as a result of the semiconductor wafer W being illuminated by source light from the illumination unit or module 100. Suitably, the light reflected from the semiconductor wafer W and received by the collection unit or module 300 is separated and/or divided by the collection unit or module 300 according to waveband. For example, as shown in FIG. 1, a first dichroic filter 302 or other like wavelength responsive optical splitter diverts received light within the first short waveband along an optical path toward a first imaging sensor unit or module 310, while passing received light within the second medium waveband and the third long waveband therethrough along an optical path toward a second dichroic filter 304 or other like wavelength responsive optical splitter. As further shown in FIG. 1, the second dichroic filter 304 or other like wavelength responsive optical splitter diverts received light within the second medium waveband along an optical path toward a second imaging sensor unit or module 320, while passing received light within the third long waveband therethrough along an optical path toward a third imaging sensor unit or module 330. It is noted that in FIG. 1 and in some other drawings, filters such as the dichroic filters 302 and 304 may be illustrated as filter wheels. This is a convenient arrangement that enables the system to be quickly reconfigured to use different wavebands by rotating the filter wheel to place the desired filter into the beam path. However, more generally the first dichroic filter 302 could be a single filter, and likewise the second dichroic filter 304 could be a single filter.

In some suitable embodiments, each imaging sensor unit or module 310, 320 and 330 includes an image sensor 312, 322 and 332. For example, each image sensor 312, 322 and 332 may comprise a charge coupled device (CCD) image sensor, a time delay integration (TDI) (CCD) image sensor, a photomultiplier tube (PMT) image sensor, avalanche photodiode (APD) image sensor or the like, and may be individually selected and/or tuned to and/or for the particular waveband of the reflected light received thereby, respectively. In some embodiments, as shown in FIG. 1, each imaging sensor unit or module 310, 320 and 330 may include suitable optics (for example, such as lenses 314 and 316, lenses 324 and 326 and lenses 334 and 336, respectively) for forming or projecting on its associated image sensor 312, 322 and 332 a latent or other like image of the semiconductor wafer W at the illuminated location of the semiconductor wafer W in accordance with the reflected light in the corresponding waveband received by the respective imaging sensor unit or module 310, 320 and 330. As with the image sensors 312, 322 and 332, the optics (for example, lenses 314 and 316, lenses 324 and 326 and lenses 334 and 336) of each imaging sensor unit or module 310, 320 and 330 may be individually selected and/or tuned to and/or for the waveband of reflected light being received by the respective imaging sensor unit or module 310, 320 and 330.

In practice, each image sensor 312, 322 and 332 generates a corresponding signal and/or image data in accordance with the latent or other image formed thereon and/or detected thereby as a result of receiving the particular waveband of reflected light directed thereto by the collection unit or module 300. In some suitable embodiments, the signals and/or image data from each image sensor 312, 322 and 332 are transmitted or otherwise provided to the image processor 400, which generates a first short waveband image from the signal and/or image data supplied by the short waveband image sensor 312, a second medium waveband image from the signal and/or image data supplied by the medium waveband image sensor 322 and a third long waveband image from the signal and/or image data supplied by the long waveband image sensor 334. Although not illustrated, it will be appreciated that the system is configured to effectuate rastering or step-and-image-and-repeat of the light beam across the surface of the wafer to acquire an image of the entire wafer W or of a portion of interest thereof (e.g., the portion containing integrated circuit dies). For example, this can be achieved by using an X-Y translation stage (not shown) holding the wafer W. Advantageously, because the three images generated by the three respective image sensors 312, 322 and 332 are produced simultaneously using the same illuminated spot on the wafer W, the resulting wafer images are automatically spatially registered to one another, thus eliminating spatial misregistration that might result if the images were acquired separately, and/or eliminating an image spatial registration processing step.

Figure 2:
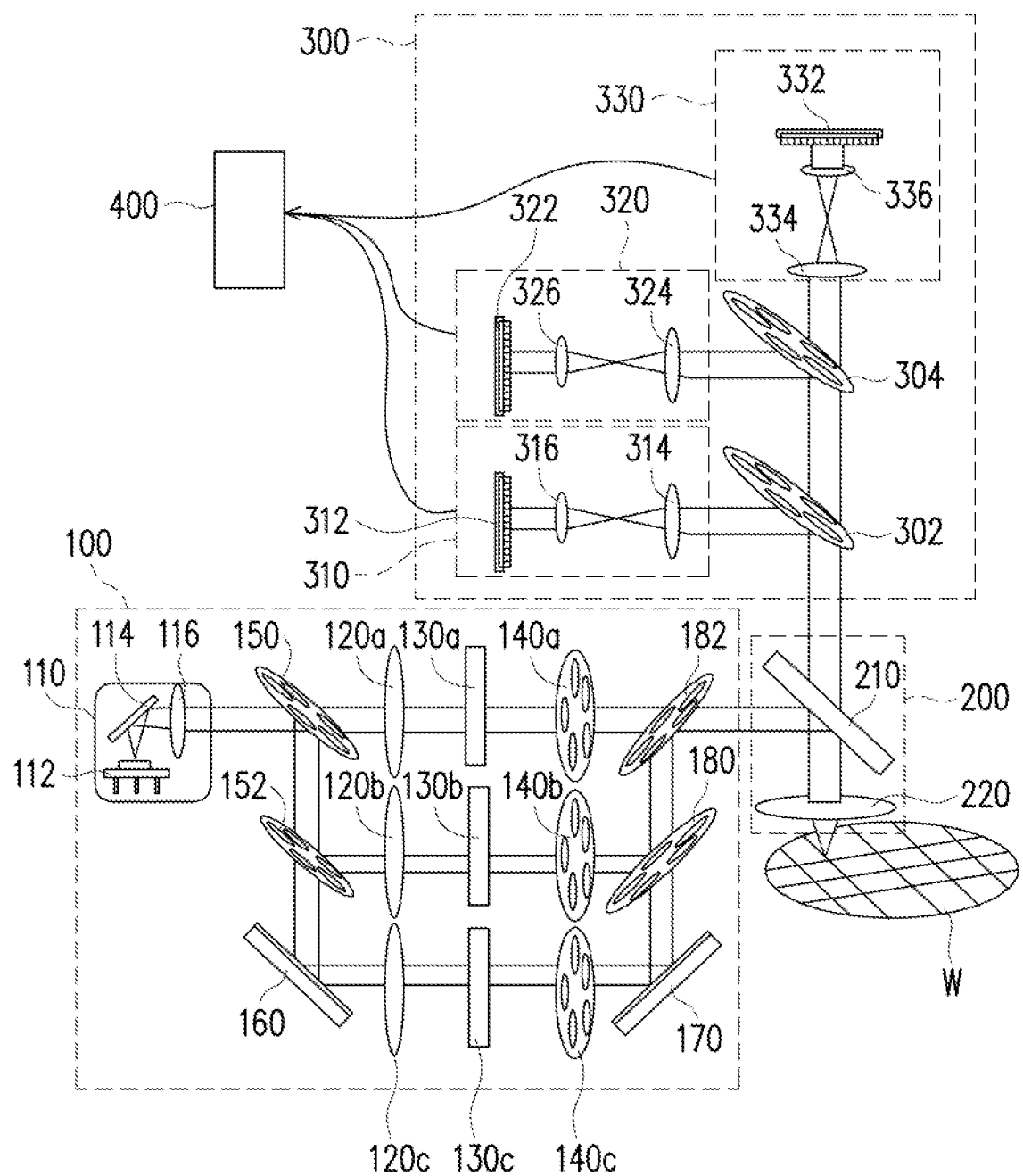
FIG. 2 diagrammatically illustrates an optical inspection system and/or apparatus for inspecting semiconductor wafers for defects in accordance with still some further embodiments disclosed herein.

With reference now to FIG. 2, another embodiment of the optical inspection system and/or apparatus 1000 is shown. To the extend the embodiment shown in FIG. 2 is the same or substantially similar to the embodiment shown in FIG. 1, the same and/or similar reference characters are reused to indicate the same or similar elements as between the embodiments of FIGS. 1 and 2, and further detailed discussion will not be repeated here from the sake of simplicity and/or brevity. Notably, the embodiment of FIG. 2 primarily deviates and/or differs from the embodiment of FIG. 1 with respect to the illumination unit or module 100. More specifically, as shown in FIG. 2, in the illumination unit or module 100, the source light produced by the illumination unit or module 100 is separated or otherwise divided according to waveband such that each waveband of source light follows a different optical path within the illumination unit or module 100, and in turn the different wavebands of source light are recombined to collectively and/or simultaneously illuminate the semiconductor wafer W.

In some embodiments, as shown in FIG. 2, the common light source 110 again generates and/or emits a beam of light or source light having wavelengths in a plurality of wavebands, for example, including a first short wavelength waveband, a second medium wavelength waveband and a third long wavelength waveband. As shown in FIG. 2, the beam of light from the light source 110 is initially directed to and/or impinges on a first dichroic filter 150 or other like wavelength responsive optical splitter. The first dichroic filter 150 or other like wavelength responsive optical splitter diverts received light within the first short waveband along an optical path toward a first set of optical parameter regulating elements (for example, including any one or more of an ND filter 120a, a polarizer 130a and/or an aperture plate 140a, as shown in FIG. 2), while passing received light within the second medium waveband and the third long waveband therethrough along an optical path toward a second dichroic filter 152 or other like wavelength responsive optical splitter. As further shown in FIG. 2, the second dichroic filter 152 or other like wavelength responsive optical splitter diverts received light within the second medium waveband along an optical path toward a second set of optical parameter regulating elements (for example, including any one or more of an ND filter 120b, a polarizer 130b and/or an aperture plate 140b, as shown in FIG. 2), while passing received light within the third long waveband therethrough along an optical path toward a third set of optical parameter regulating elements (for example, including any one or more an ND filter 120c, a polarizer 130c and/or an aperture plate 140c, as shown in FIG. 2), for example, by way of a mirror 160 or other like beam steering element as shown in FIG. 2. It is noted that in FIG. 2 and in some other drawings, aperture plates such as the aperture plates 140a, 140b, and 140c are illustrated as aperture wheels having multiple apertures. This is a convenient arrangement that enables the system to be quickly reconfigured to use different beam spots by rotating the aperture wheel to place the desired aperture into the beam path. However, more generally a single aperture for the desired beam spot could be used in place of an illustrated aperture wheel.

As shown in FIG. 2, the ND filter 120a, the polarizer 130a and/or the aperture plate 140a are arranged along the optical path of the short waveband source light diverted from the first dichroic filter 150 or other like wavelength responsive optical splitter, for example, such that the short waveband source light passes through each one in succession. In some embodiments, each and/or any one or more of the ND filter 120a, the polarizer 130a and/or the aperture plate 140a may be selectively adjustable to regulate an optical parameter of and/or for the short waveband source light passing therethrough. For example, the ND filter 120a may be selectively adjustable to control and/or regulate an intensity of the short waveband source light, the polarizer 130a may be selectively adjustable to control and/or regulate a polarization of the short waveband source light, and/or the aperture plate 140a may be selectively adjustable to control and/or regulate a size and/or shape of an aperture provided for the short waveband source light. Accordingly, independently of the medium and long waveband source light produced by the illumination unit or module 100, the short waveband source light produced by the illumination unit or module 100 may be selectively conditioned, manipulated and/or modified accordingly. That is to say, advantageously, the optical parameters of and/or for the short waveband source light may be regulated independently of any regulation of the optical parameters of and/or for the medium and long waveband source light.

As shown in FIG. 2, the ND filter 120b, the polarizer 130b and/or the aperture plate 140b are arranged along the optical path of the medium waveband source light diverted from the second dichroic filter 152 or other like wavelength responsive optical splitter, for example, such that the medium waveband source light passes through each one in succession. In some embodiments, each and/or any one or more of the ND filter 120b, the polarizer 130b and/or the aperture plate 140b may be selectively adjustable to regulate an optical parameter of and/or for the medium waveband source light passing therethrough. For example, the ND filter 120b may be selectively adjustable to control and/or regulate an intensity of the medium waveband source light, the polarizer 130b may be selectively adjustable to control and/or regulate a polarization of the medium waveband source light, and/or the aperture plate 140b may be selectively adjustable to control and/or regulate a size and/or shape of an aperture provided for the medium waveband source light. Accordingly, independently of the short and long waveband source light produced by the illumination unit or module 100, the medium waveband source light produced by the illumination unit or module 100 may be selectively conditioned, manipulated and/or modified accordingly. That is to say, advantageously, the optical parameters of and/or for the medium waveband source light may be regulated independently of any regulation of the optical parameters of and/or for the short and long waveband source light.

As shown in FIG. 2, the ND filter 120c, the polarizer 130c and/or the aperture plate 140c are arranged along the optical path of the long waveband source light passed through the second dichroic filter 152 or other like wavelength responsive optical splitter, for example, such that the long waveband source light passes through each one in succession. In some embodiments, each and/or any one or more of the ND filter 120c, the polarizer 130c and/or the aperture plate 140c may be selectively adjustable to regulate an optical parameter of and/or for the long waveband source light passing therethrough. For example, the ND filter 120c may be selectively adjustable to control and/or regulate an intensity of the long waveband source light, the polarizer 130c may be selectively adjustable to control and/or regulate a polarization of the long waveband source light, and/or the aperture plate 140c may be selectively adjustable to control and/or regulate a size and/or shape of an aperture provided for the long waveband source light. Accordingly, independently of the short and medium waveband source light produced by the illumination unit or module 100, the long waveband source light produced by the illumination unit or module 100 may be selectively conditioned, manipulated and/or modified accordingly. That is to say, advantageously, the optical parameters of and/or for the long waveband source light may be regulated independently of any regulation of the optical parameters of and/or for the short and medium waveband source light.

As shown in FIG. 2, after each of the respective wavebands of source light has passed through and/or been independently conditioned by its respective set of optical parameter regulating elements (i.e., ND filter 120a, polarizer 130a and aperture plate 140a, and ND filter 120b, polarizer 130b and aperture plate 140b, and ND filter 120c, polarizer 130c, and aperture plate 140c, respectively), the short, medium and long wavebands of source light are recombined by a suitable array of optical elements, for example, such as the mirror 170 or other like beam steering element and dichroic filters 180 and 182 or other like optical combiners, such that the recombined source light produced by the illumination unit or module 100 (now again including the short, medium and long wavebands) is supplied to the focusing unit or module 200 to illuminate the semiconductor wafer W.

Figure 3:
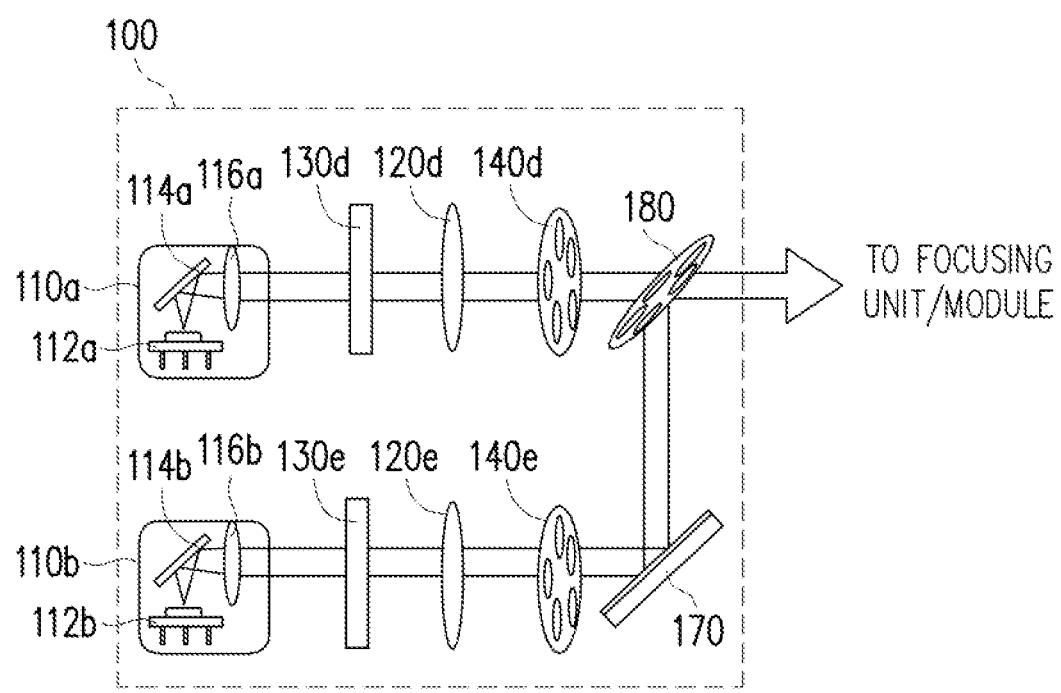
FIG. 3 diagrammatically illustrates an illumination unit or module of an optical inspection system and/or apparatus for inspecting semiconductor wafers for defects in accordance with some embodiments disclosed herein FIG. 4 diagrammatically illustrates examples of various combinations of optical characteristics and/or traits which may be produced independently in each of various different wavebands of source light used to illuminate a semiconductor wafer in accordance with some embodiments disclosed herein.

With reference now to FIG. 3, another embodiment of the illumination unit or module 100 for the optical inspection system and/or apparatus 1000 is shown. To the extend the embodiment shown in FIG. 3 is the same or substantially similar to the embodiment shown in FIG. 2, the same and/or similar reference characters are reused to indicate the same or similar elements as between the embodiments of FIGS. 2 and 3, and further detailed discussion will not be repeated here from the sake of simplicity and/or brevity. Notably, the embodiment of FIG. 3 primarily deviates and/or differs from the embodiment of FIG. 2 in that instead of utilizing a common multi-waveband light source 110 as shown in FIG. 2, the embodiment of the illumination unit or module 100 as shown in FIG. 3. employs a plurality of light sources 110a and 110b each generating and/or emitting source light at and/or in a different waveband. Advantageously, in the embodiment of FIG. 3, the source light produced by the illumination unit or module 100 does not have to be divided into its respective wavebands prior to independently conditioning and/or regulating the optical parameters of the respective wavebands of source light. For example, the dichroic filter 150 or other like wavelength responsive optical splitter employed in the embodiment of FIG. 2 does not have to be employed in the embodiment of FIG. 3.

As shown in FIG. 3, in the illumination unit or module 100, the short waveband source light generated and/or emitted by the light source 110a and long waveband source light generated and/or emitted by the light source 110b follow different optical paths within the illumination unit or module 100, and in turn the different wavebands of source light are recombined to collectively and/or simultaneously illuminate the semiconductor wafer W.

Like the light source 110 shown in FIG. 2, each light source 110a and 110b as shown in FIG. 3 may include an associated light generating and/or emitting device 112a and 112b, for example, such as a suitable laser or light emitting diode (LED) or other like light generating/emitting device, along with suitable beam steering and/or shaping optics, for example, such as the illustrated mirrors 114a and 114b and lenses 116a and 116b. In some suitable embodiments, an optional optical amplifier or the like may further be included with each light source 110a and 110b to amplify and/or increase an intensity of the light produced by the light sources 110a and 110b and/or devices 112a and 112b, for example, to twice or four times or more of its original intensity. For simplicity and/or clarity, only a single device 112a and 112b is shown in FIG. 3 in connection with each light source 110a and 110b. However, in practice, it is to be appreciated that each light source 110a and 110b may include a plurality of such light generating/emitting devices. Suitably, the light source 110a may produce source light in and/or at a first waveband, for example, the short, medium or long waveband, while the light source 110b may produce source in and/or at a second waveband, different from the first waveband.

As shown in FIG. 3, an ND filter 120d, polarizer 130d and/or aperture plate 140d are arranged along the optical path of the first waveband source light produced from the light source 110a, for example, such that the first waveband source light passes through each one in succession. In some embodiments, each and/or any one or more of the ND filter 120d, the polarizer 130d and/or the aperture plate 140d may be selectively adjustable to regulate an optical parameter of and/or for the first waveband source light passing therethrough. For example, the ND filter 120d may be selectively adjustable to control and/or regulate an intensity of the first waveband source light, the polarizer 130d may be selectively adjustable to control and/or regulate a polarization of the first waveband source light, and/or the aperture plate 140d may be selectively adjustable to control and/or regulate a size and/or shape of an aperture provided for the first waveband source light. Accordingly, independently of the second waveband source light produced by the illumination unit or module 100, the first waveband source light produced by the illumination unit or module 100 may be selectively conditioned, manipulated and/or modified accordingly. That is to say, advantageously, the optical parameters of and/or for the first waveband source light may be regulated independently of any regulation of the optical parameters of and/or for the second waveband source light.

As shown in FIG. 3, an ND filter 120e, polarizer 130e and/or aperture plate 140e are arranged along the optical path of the second waveband source light produced from the light source 110b, for example, such that the second waveband source light passes through each one in succession. In some embodiments, each and/or any one or more of the ND filter 120e, the polarizer 130e and/or the aperture plate 140e may be selectively adjustable to regulate an optical parameter of and/or for the second waveband source light passing therethrough. For example, the ND filter 120e may be selectively adjustable to control and/or regulate an intensity of the second waveband source light, the polarizer 130e may be selectively adjustable to control and/or regulate a polarization of the second waveband source light, and/or the aperture plate 140e may be selectively adjustable to control and/or regulate a size and/or shape of an aperture provided for the second waveband source light. Accordingly, independently of the first waveband source light produced by the illumination unit or module 100, the second waveband source light produced by the illumination unit or module 100 may be selectively conditioned, manipulated and/or modified accordingly. That is to say, advantageously, the optical parameters of and/or for the second waveband source light may be regulated independently of any regulation of the optical parameters of and/or for the first waveband source light.

As shown in FIG. 3, after each of the respective wavebands of source light has passed through and/or been independently conditioned by its respective set of optical parameter regulating elements (i.e., ND filter 120d, polarizer 130d and aperture plate 140d, and ND filter 120e, polarizer 130e and aperture plate 140e, respectively), the first and second wavebands of source light are recombined by a suitable array of optical elements, for example, such as the mirror 170 or other like beam steering element and dichroic filter 180 or other like optical combiner, such that the recombined source light produced by the illumination unit or module 100 (now again including the first and second wavebands) is supplied to the focusing unit or module 200 to illuminate the semiconductor wafer W.

Figure 4:
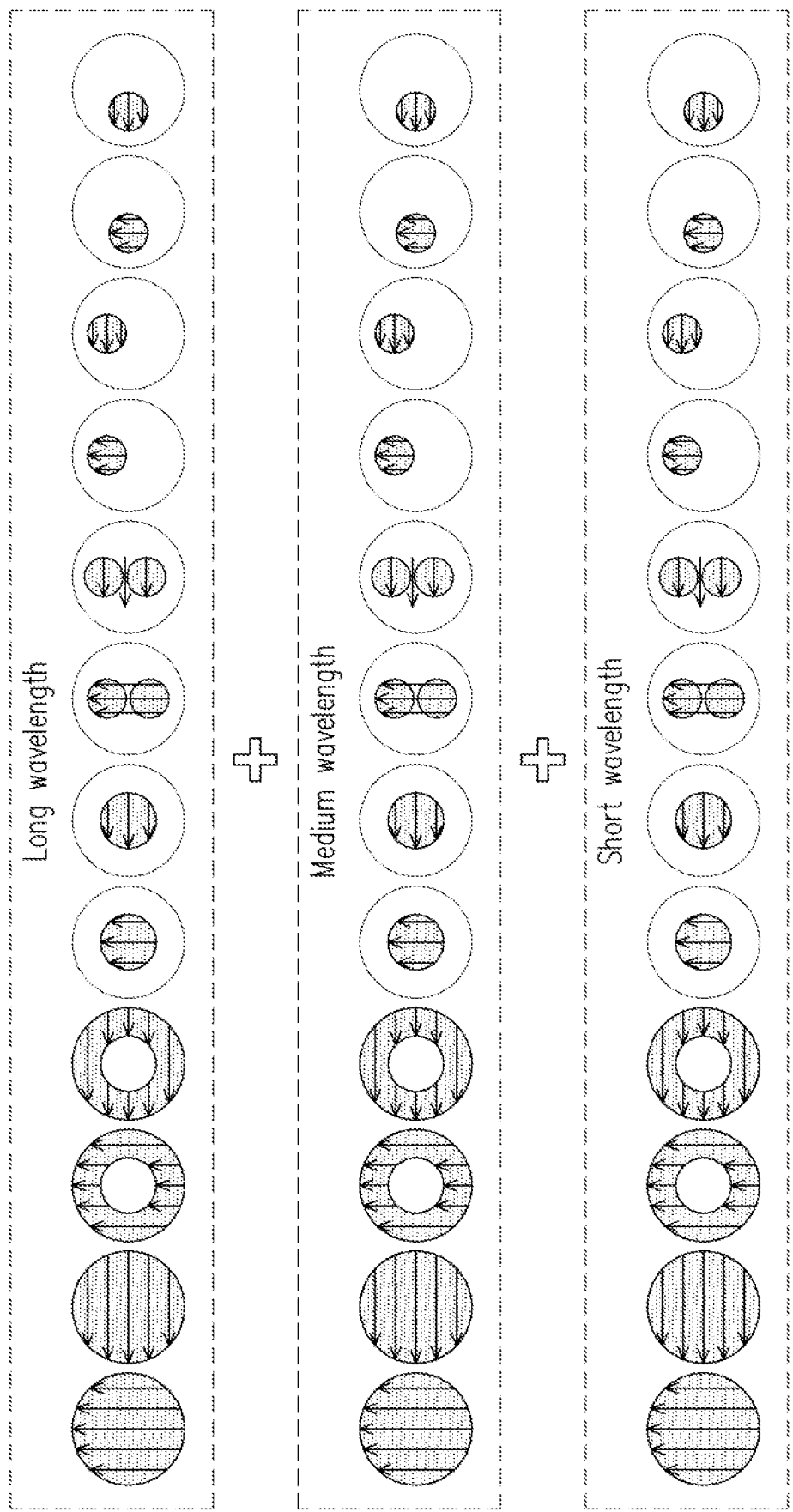

In some suitable embodiments, as disclosed herein, multi-waveband source light collectively and/or simultaneously illuminates the semiconductor wafer W. Nevertheless, in accordance with some embodiments (for example, as shown in FIGS. 2 and 3) each waveband of the source light illuminating the semiconductor wafer W may advantageously be independently conditioned, manipulated and/or modified, for example, to independently control and/or regulate a shape of a spot produced on the semiconductor wafer by each waveband of the source light, a size of the spot produced on the semiconductor wafer by each waveband of the source light, an aperture provided for each waveband of the source light, a polarization of each waveband of the source light and an intensity of each waveband of the source light. FIG. 4 illustrates examples of various combinations of some of the foregoing which may be produced in each of three different wavebands, i.e., the short waveband (depicted in the lower row of examples), the medium waveband (depicted in the middle row of examples) and long waveband (depicted in the upper row of examples). In FIG. 4, a spot shape and/or size formed on the semiconductor wafer W by a corresponding waveband of source light is indicated by the shaded area in each example and a polarization direction of a corresponding waveband of source light is indicated by the arrows in each example. In practice, the combined multi-waveband source light illuminating the semiconductor wafer W may be formed using any combination of the various examples, i.e., with one example being selected from each row. Accordingly, as will be appreciated by those of ordinary skill in the art, the number of available combinations is vast.

Figure 5:
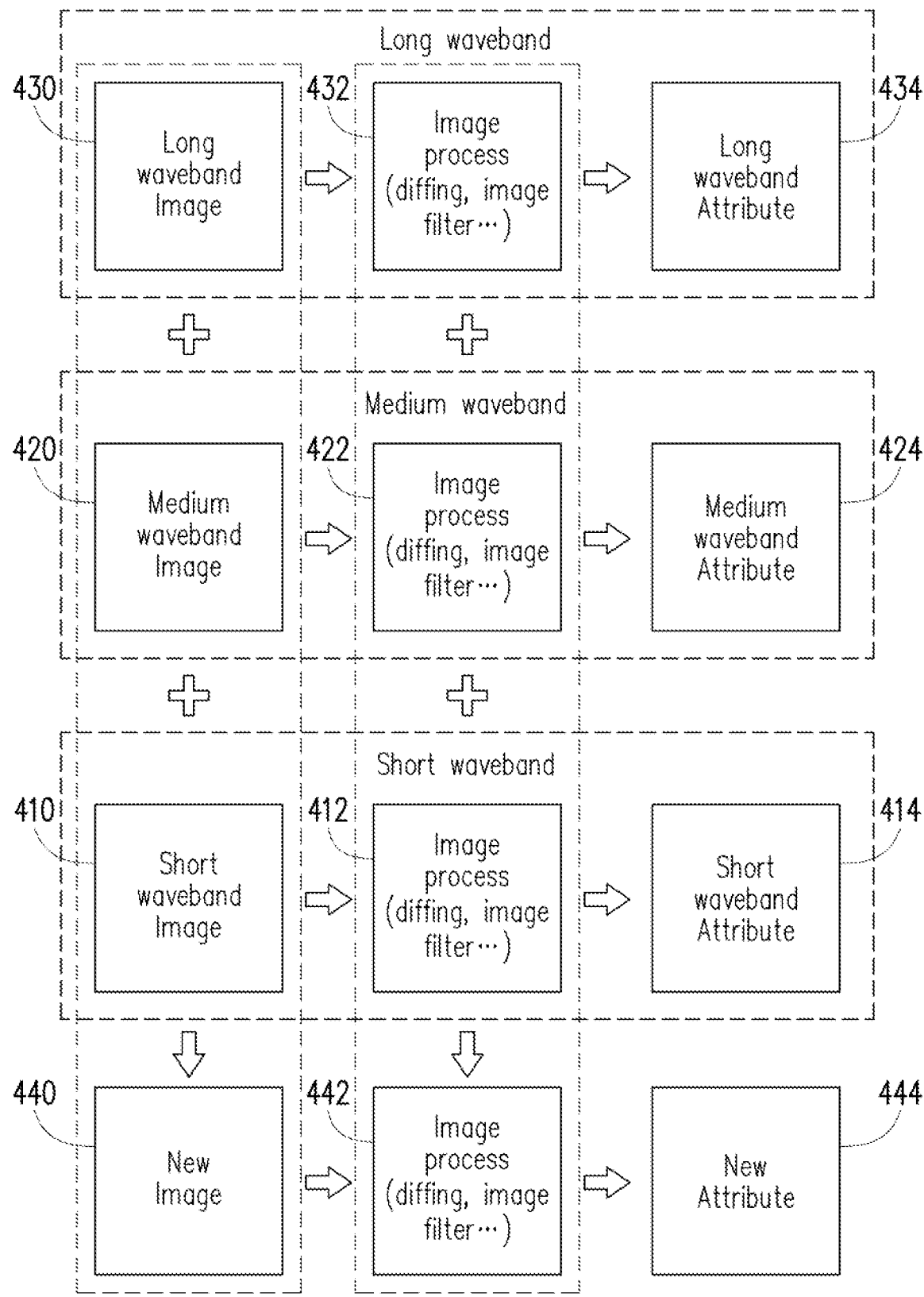
FIG. 5 diagrammatically illustrates imaging processing perform by an image processor in accordance with some embodiments disclosed herein.

FIG. 5 diagrammatically illustrates an example of image processing performed, for example, by the image processor 400, in accordance with some embodiments disclosed herein. As shown in FIG. 5, a first short waveband image 410 is generated from the signal and/or image data supplied by the short waveband image sensor 312, a second medium waveband image 420 is generated from the signal and/or image data supplied by the medium waveband image sensor 322 and a third long waveband image 430 is generated from the signal and/or image data supplied by the long waveband image sensor 334. In some embodiments, the images 410, 420 and 430 may be added or otherwise combined to produce a resulting image 440. Suitably, when adding or combining the images 410, 420 and 430, each image may be selectively provided with a different digital gain or weighting or the like to produce the resulting image 440 as desired, for example, such that the contribution to the resulting image 440 from a given sensed or detected waveband of reflected light is more or less emphasized accordingly with respect to contributions from the other sensed or detected wavebands.

In some suitable embodiments, each image 410, 420, 430 and 440 may have selected image processing applied thereto, represented in FIG. 5 by image processing protocols or routines 412, 422, 432 and 442. Suitably, each image processing protocol or routine 412, 422, 432, and 442 may be independently established and/or tuned to the particular image 410, 420, 430 and 440 and/or waveband for which it is intended. In some suitable embodiments, a given image processing protocol and/or routine may include producing a difference image, suitable image filtering, etc. In practice, the difference image may be produced by calculating or other determining the difference between the test image (i.e., image 410, 420, 430 and 440) and a corresponding reference image (for example, which represents a non-defective image or intended design of the semiconductor wafer W at the location being inspected). In some suitable embodiments, the reference image may be particular or specific to the associated waveband of the test and reference images being differentiated and/or compared to one another. According to the image processing protocol and/or routine applied, various attributes (for example, diagrammatically indicated in FIG. 5 as attributes 414, 424, 434 and 444) may be determined for each waveband and/or the resulting image. In some suitable embodiments, these attributes may represent useful quantities calculated from respective images for further inspection analysis, for example, for distinguishing real defects or defect signals from optical noise or the like. For example, in some embodiments, the attributes may represent the grey scale intensity levels or the like of test, reference and/or difference images. In some embodiments, image processor 400 may use a convolution neural network (CNN), such as region based CNN (R-CNN) to simultaneously detect and classify defects.

For illustrative purposes, various embodiments are shown and/or described herein with explicit reference to short, medium and long wavebands or with explicit reference to multiple different wavebands, along with associated elements and/or components, associated generated images, associated image processing and/or other method steps, etc. However, it is to be appreciated that in practice some suitable embodiments may employ more or less than the explicitly referenced number and/or categories of wavebands and the various embodiments shown and/or described herein may be modified accordingly to support the same.

In some suitable embodiments, a system controller (not shown) may be provided to automatically, or otherwise as programmed or directed by a user, adjust and/or operate various system elements and/or components, for example, such as the disclosed ND filters, polarizers, aperture plates, light sources, mount for the semiconductor wafer, etc. to conduct a desired or established inspection routine. Suitably, the system controller may be programmed, provisioned and/or otherwise provided with one or more inspection routines that a user may manually or otherwise select for the system and/or apparatus 1000 to execute.

In some embodiments, various elements and/or components described herein (for example, such as the image processor 400 or a system controller) may be implemented via hardware, software, firmware or a combination thereof. In particular, one or more controllers or processors be embodied by electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/ or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

In the following, some further illustrative embodiments are described.

In some embodiments, a method of qualifying semiconductor wafer processing includes: illuminating a semiconductor wafer simultaneously with source light having wavelengths in a plurality of wavebands, including at least a first waveband and a second waveband, the second waveband being different from the first waveband; separating light reflected from the semiconductor wafer as a result of said illuminating, the separating dividing the reflected light according to waveband; generating a first image of the semiconductor wafer based on reflected light separated into the first waveband; generating a second image of the semiconductor wafer base on reflected light separated into the second waveband; and analyzing the first and second images to qualify the semiconductor wafer based on a predetermined value of a defect count.

In some further embodiments, the generating of the first and second images includes: directing reflected light separated into the first waveband along a first optical path to a first image sensor from which the first image is generated; and directing reflected light separated into the second waveband along a second optical path to a second image sensor from which the second image is generated, the second image sensor being different than the first image sensor.

In still additional embodiments, illuminating includes: regulating an optical parameter of the source light having wavelengths in the first waveband; and regulating the optical parameter of the source light having wavelengths in the second waveband; wherein regulating the optical parameter of the source light having wavelengths in the second waveband is done independently of regulating the optical parameter of the source light having wavelengths in the first waveband.

In some embodiments, the optical parameter includes at least one of a shape of a spot produced on the semiconductor wafer by the source light, a size of the spot produced on the semiconductor wafer by the source light, an aperture provided for the source light, a polarization of the source light and an intensity of the source light.

In yet further embodiments, the illuminating comprises: generating source light having wavelengths in the first waveband from a first light source; generating source light having wavelengths in the second waveband from a second light source, the second light source being different than the first light source; independently conditioning at least one of intensity, polarization, and/or beam spot of the source light having wavelengths in the first waveband and source light having wavelengths in the second waveband; and combining the independently conditioned source light from the first light source and the independently conditioned source light from the second light source such that they illuminate the semiconductor device together.

In some further embodiments, said illuminating comprises: generating the source light having wavelengths in the first waveband and the second waveband from a common light source; using at least one dichroic filter, separating the source light generated by the common light source according to waveband, such that the source light having wavelengths in the first waveband follows a first optical path while the source light having wavelengths in the second waveband follows a second optical path, the second optical path diverging from the first optical path; and recombining the source light having wavelengths in the first waveband with the source light having wavelengths in the second waveband such that the recombined source light illuminates the semiconductor wafer.

In some embodiments, the first optical path passes through at least one of a first neutral-density filter, a first polarizer and a first aperture plate; and the second optical path pass through at least one of a second neutral-density filter different than the first neutral-density filter, a second polarizer different than the first polarizer and a second aperture plate different than the first aperture plate.

In yet further embodiments, the analyzing includes: applying a first imaging processing to the first image to detect a first type of defect in the semiconductor wafer; and applying a second imaging processing to the second image to detect a second type of defect in the semiconductor wafer.

In some embodiments, the method further comprises: combining the first image with the second image to produce a resulting image; wherein the analyzing includes image processing the resulting image to detect at least one defect in the semiconductor wafer.

In some further embodiments, an optical inspection apparatus for qualifying semiconductor wafer processing includes: an illumination module producing source light illuminating a semiconductor wafer, the source light having wavelengths in a first waveband and a second waveband, the illumination module including a first optical element arranged along a first optical path and a second optical element arranged along a second optical path, the first optical element regulating an first optical parameter of the source light in the first waveband and the second optical element regulating an second optical parameter of the source light in the second waveband; a collection module including a first image sensor and a second image sensor, the first image senor receiving reflected light in the first waveband from the semiconductor wafer as a result of the semiconductor wafer's illumination with the source light from the illumination module and the second image sensor receiving reflected light in the second waveband from the semiconductor wafer as the result of the semiconductor wafer's illumination with source light from the illumination module; and an image processor that, processes a first image of the semiconductor wafer generated in accordance with data obtained from the first image sensor and processes a second image of the semiconductor wafer generated in accordance with data obtained from the second image sensor, to qualify the semiconductor wafer based on a predetermined value of a defect count.

In still further embodiments, the first optical element is one of a first neutral density filter, a first polarizer and a first aperture plate, and the second optical element is one of a second neutral density filter, a second polarizer and a second aperture plate.

In yet additional embodiments, the illumination module further comprises: combining optics that combine the source light in the first waveband after it passes through the first optical element with the source light in the second waveband after it passes through the second optical element.

In some further embodiments, the illumination module further comprises: a common light source that emits light having wavelengths in both the first and second wavebands; and dividing optics that separates light emitted from the common light source according to waveband, such that light emitted from the common light source in the first waveband is directed along the first optical path, while light emitted from the common light source in the second waveband is directed along the second optical path.

In some additional embodiments, the illumination module further comprises: a first light source that emits light in the first waveband along the first optical path; and a second light source that emits light in the second waveband along the second optical path In some embodiments, the image processor combines the first image of the semiconductor wafer and the second image of the semiconductor wafer together to produce a resulting image and processes the resulting image to detect if there is a defect in the semiconductor wafer.

In some embodiments, an inspection method for qualifying semiconductor wafer processing includes: illuminating a semiconductor wafer with source light having wavelengths in a plurality of wavebands, including at least a first waveband and a second waveband, the second waveband being different from the first waveband; prior to the illuminating, conditioning the source light having wavelengths in the first waveband; and prior to the illuminating, conditioning the source light having wavelengths in the second waveband; wherein the conditioning of the source light having wavelengths in the second waveband is carried out independently of the conditioning of the source light having wavelengths in the first waveband.

In some further embodiments, the method also includes: separating light reflected from the semiconductor device as a result of the illuminating, the separating dividing the reflected light according to waveband such that reflected light in the first waveband is directed to a first image sensor, while reflected light in the second waveband is directed to a second image sensor; generating a first image of the semiconductor wafer in accordance with data produced from the first image sensor; and, generating a second image of the semiconductor wafer in accordance with data produced from the second image sensor.

In still further embodiments, the method also comprises: applying a first imaging processing to the first image to detect if a first type of defect is present in the semiconductor wafer; and applying a second imaging processing to the second image to detect if a second type of defect is present in the semiconductor wafer.

In yet further embodiments, the method further includes: combining the first image with the second image to produce a resulting image; and image processing the resulting image to detect if a defect is present in the semiconductor wafer.

In still one more embodiment, conditioning the source light having wavelengths in the first waveband includes regulating one of a shape of a spot produced on the semiconductor wafer by the source light having wavelengths in the first waveband, a size of the spot produced on the semiconductor wafer by the source light having wavelengths in the first waveband, an aperture provided for the source light having wavelengths in the first waveband, a polarization of the source light having wavelengths in the first waveband and an intensity of the source light having wavelengths in the first waveband; and conditioning the source light having wavelengths in the second waveband includes regulating one of a shape of a spot produced on the semiconductor wafer by the source light having wavelengths in the second waveband, a size of the spot produced on the semiconductor wafer by the source light having wavelengths in the second waveband, an aperture provided for the source light having wavelengths in the second waveband, a polarization of the source light having wavelengths in the second waveband and an intensity of the source light having wavelengths in the second waveband.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of qualifying semiconductor wafer processing, said method comprising:
using a common light source, emitting light having wavelengths in both a first waveband and a second waveband;
separating the light emitted using the common light source according to waveband using dividing optics, such that the light emitted using the common light source in the first waveband is directed along a first optical path, while the light emitted using the common light source in the second waveband is directed along a second optical path;
regulating a first optical parameter of the common source light in the first waveband using a first optical element arranged along the first optical path;
regulating a second optical parameter of the common source light in the second waveband using a second optical element arranged along the second optical path;
combining the source light in the first waveband after it passes through the first optical element with the source light in the second waveband after it passes through the second optical element using combining optics to produce combined source light;
illuminating a semiconductor wafer with the combined source light;
separating light reflected from the semiconductor wafer as a result of said illuminating, said separating dividing the reflected light according to waveband;
generating a first image of the semiconductor wafer based on reflected light separated into the first waveband;
generating a second image of the semiconductor wafer base on reflected light separated into the second waveband; and,
analyzing the first and second images to qualify the semiconductor wafer based on a predetermined value of a defect count;
wherein the analyzing includes applying a first imaging processing to the first image to detect a first type of defect in the semiconductor wafer and applying a second imaging processing to the second image to detect a second type of defect in the semiconductor wafer, wherein the first type of defect and the second type of defect are different types of defects.

2. The method of claim 1, wherein said generating of the first and second images includes:
   directing reflected light separated into the first waveband along a first reflected light optical path to a first image sensor from which the first image is generated; and
   directing reflected light separated into the second waveband along a second reflected light optical path to a second image sensor from which the second image is generated, said second image sensor being different than the first image sensor.

3. The method of claim 1, wherein:
   the first optical parameter includes at least one of a shape of a spot produced on the semiconductor wafer by the common source light in the first waveband and a size of the spot produced on the semiconductor wafer by the common source light in the first waveband, and
   the second optical parameter includes at least one of a shape of a spot produced on the semiconductor wafer by the common source light in the second waveband and a size of the spot produced on the semiconductor wafer by the common source light in the second waveband.

4. The method of claim 3, wherein:
   the first optical parameter including at least one of the shape of the spot produced on the semiconductor wafer by the common source light in the first waveband and the size of the spot produced on the semiconductor wafer by the common source light in the first waveband matches an expected shape and/or size of defects of a first class; and
   the second optical parameter including at least one of the shape of the spot produced on the semiconductor wafer by the common source light in the second waveband and the size of the spot produced on the semiconductor wafer by the source light in the second waveband matches an expected shape and/or size of defects of a second class.

5. The method of claim 1, wherein:
   the first optical parameter includes at least one of an aperture provided for the common source light in the first waveband, and a polarization of the common source light in the first waveband; and
   the second optical parameter includes at least one of an aperture provided for the common source light in the second waveband, and a polarization of the common source light in the second waveband.

6. The method of claim 1, wherein the dividing optics comprise at least one dichroic filter.

7. The method of claim 6, wherein:
   the first optical element arranged along the first optical path comprises at least one of a first neutral-density filter, a first polarizer and a first aperture plate; and
   the second optical element arranged along the second optical path comprises at least one of a second neutral-density filter different than the first neutral-density filter, a second polarizer different than the first polarizer and a second aperture plate different than the first aperture plate.

8. The method of claim 1, wherein the analyzing includes:
   classifying the defects detected by applying the first imaging processing to the first image as defects of the first type of defect; and
   classifying the defects detected by applying the second imaging processing to the second image as defects of the second type of defect.

9. The method of claim 1, further comprising:
   combining the first image with the second image to produce a resulting image; and
   wherein the analyzing includes image processing the resulting image to detect at least one defect in the semiconductor wafer.

10. An optical inspection apparatus for qualifying semiconductor wafer processing, said apparatus comprising:
    an illumination module producing source light illuminating a semiconductor wafer, said source light having wavelengths in a first waveband and a second waveband, said illumination module including:
       a common light source that emits light having wavelengths in both the first waveband and the second waveband,
       dividing optics that separates light emitted from the common light source according to waveband, such that light emitted from the common light source in the first waveband is directed along a first optical path, while light emitted from the common light source in the second waveband is directed along a second optical path,
       a first optical element arranged along the first optical path and a second optical element arranged along the second optical path, said first optical element regulating a first optical parameter of the common source light in the first waveband and said second optical element regulating a second optical parameter of the common source light in the second waveband, and
       combining optics that combine the source light in the first waveband after it passes through the first optical element with the source light in the second waveband after it passes through the second optical element;
    a collection module including a first image sensor and a second image sensor, said first image senor receiving reflected light in the first waveband from the semiconductor wafer as a result of the semiconductor wafer's illumination with the source light from the illumination module and said second image sensor receiving reflected light in the second waveband from the semiconductor wafer as the result of the semiconductor wafer's illumination with source light from the illumination module; and
    an image processor that, processes a first image of the semiconductor wafer generated in accordance with data obtained from the first image sensor and processes a second image of the semiconductor wafer generated in accordance with data obtained from the second image sensor, to qualify the semiconductor wafer based on a predetermined value of a defect count.

11. The optical inspection apparatus of claim 10, wherein the first optical element includes at least one of a first polarizer, and the second optical element includes at least one of a second polarizer.

12. The optical inspection apparatus of claim 10, wherein the first optical element includes a first aperture plate, and the second optical element includes a second aperture plate.

13. The optical apparatus of claim 10, wherein the first optical parameter includes a size and/or shape of a spot produced on the semiconductor wafer by the common source light in the first waveband, and the second optical parameter includes a size and/or shape of a spot produced on the semiconductor wafer by the common source light in the second waveband.

14. The optical apparatus of claim 10, wherein the image processor combines the first image of the semiconductor wafer and the second image of the semiconductor wafer together to produce a resulting image and processes the resulting image to detect if there is a defect in the semiconductor wafer.

15. An inspection method for qualifying semiconductor wafer processing, said method comprising:
   illuminating a semiconductor wafer with source light having wavelengths in a plurality of wavebands, including at least a first waveband and a second waveband, said second waveband being different from the first waveband;
   prior to the illuminating, conditioning the source light having wavelengths in the first waveband, wherein the conditioning includes regulating at least one of a shape of a spot produced on the semiconductor wafer by the source light having wavelengths in the first waveband and a size of the spot produced on the semiconductor wafer by the source light having wavelengths in the first waveband, wherein the regulated at least one of the shape of the spot produced on the semiconductor wafer by the source light having wavelengths in the first waveband and the size of the spot produced on the semiconductor wafer by the source light having wavelengths in the first waveband matches an expected shape and/or size of defects of a first class; and
   prior to the illuminating, conditioning the source light having wavelengths in the second waveband, wherein the conditioning includes regulating at least one of a shape of a spot produced on the semiconductor wafer by the source light having wavelengths in the second waveband and a size of the spot produced on the semiconductor wafer by the source light having wavelengths in the second waveband, wherein the regulated at least one of the shape of the spot produced on the semiconductor wafer by the source light having wavelengths in the second waveband and the size of the spot produced on the semiconductor wafer by the source light having wavelengths in the second waveband matches an expected shape and/or size of defects of a second class;
   separating light reflected from the semiconductor device as a result of said illuminating, said separating dividing the reflected light according to waveband such that reflected light in the first waveband is directed to a first image sensor, while reflected light in the second waveband is directed to a second image sensor;
   generating a first image of the semiconductor wafer in accordance with data produced from the first image sensor; and
   generating a second image of the semiconductor wafer in accordance with data produced from the second image sensor;
   wherein said conditioning of the source light having wavelengths in the second waveband is carried out independently of said conditioning of the source light having wavelengths in the first waveband.

16. The method of claim 15, further comprising:
   applying a first imaging processing to the first image to detect if a defect of the first class is present in the semiconductor wafer; and
   applying a second imaging processing to the second image to detect if a defect of the second class is present in the semiconductor wafer.

17. The method of claim 15, further comprising:
   combining the first image with the second image to produce a resulting image; and
   image processing the resulting image to detect if a defect is present in the semiconductor wafer.

18. The method of claim 15, wherein the illuminating includes:
   emitting the source light using a common light source; and
   separating the source light emitted using the common light source according to waveband using dividing optics, such that the source light emitted using the common light source in the first waveband is directed along a first optical path, while the source light emitted using the common light source in the second waveband is directed along a second optical path.

19. The method of claim 18, wherein the conditioning includes:
   the regulating of at least one of the shape of the spot produced on the semiconductor wafer by the source light having wavelengths in the first waveband and the size of the spot produced on the semiconductor wafer by the source light having wavelengths in the first waveband is performed using a first optical element arranged along the first optical path; and
   the regulating of at least one of the shape of the spot produced on the semiconductor wafer by the source light having wavelengths in the second waveband and the size of the spot produced on the semiconductor wafer by the source light having wavelengths in the second waveband is performed using a second optical element arranged along the second optical path.

20. The method of claim 19, wherein the illuminating further includes:
   combining the source light having wavelengths in the first waveband after it passes through the first optical element with the source light having wavelengths in the second waveband after it passes through the second optical element using combining optics to produce combined source light;
   wherein the semiconductor wafer is illuminated with the combined source light.

* * * * *